United States Patent
Lin et al.

(10) Patent No.: US 11,362,045 B2
(45) Date of Patent: Jun. 14, 2022

(54) CHIP PACKAGE STRUCTURE

(71) Applicant: Industrial Technology Research Institute, Hsinchu (TW)

(72) Inventors: Te-Hsun Lin, Hsinchu (TW); Chen-Tsai Yang, Taoyuan (TW); Kuan-Chu Wu, Kaohsiung (TW); Shao-An Yan, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 113 days.

(21) Appl. No.: 16/792,905

(22) Filed: Feb. 18, 2020

(65) Prior Publication Data
US 2021/0183789 A1     Jun. 17, 2021

(30) Foreign Application Priority Data

Dec. 17, 2019   (TW) .................. 108146251

(51) Int. Cl.
*H01L 23/00* (2006.01)
*H01L 23/538* (2006.01)
*H01L 23/31* (2006.01)
*H01L 23/14* (2006.01)
*H01L 23/498* (2006.01)

(52) U.S. Cl.
CPC .......... *H01L 23/562* (2013.01); *H01L 23/145* (2013.01); *H01L 23/3121* (2013.01); *H01L 23/49838* (2013.01); *H01L 23/5386* (2013.01)

(58) Field of Classification Search
CPC ............... H01L 23/562; H01L 23/5386; H01L 23/3121; H01L 23/145; H01L 23/49838
See application file for complete search history.

(56) References Cited

U.S. PATENT DOCUMENTS

| | | | |
|---|---|---|---|
| 5,598,036 A * | 1/1997 | Ho | H01L 23/49816 257/738 |
| 6,225,666 B1 | 5/2001 | Gadepally | |
| 6,268,568 B1 * | 7/2001 | Kim | H01L 23/49838 174/250 |
| 9,121,947 B2 | 9/2015 | Nikolic et al. | |
| 9,601,463 B2 | 3/2017 | Yu et al. | |

(Continued)

FOREIGN PATENT DOCUMENTS

| | | |
|---|---|---|
| CN | 108172564 | 6/2018 |
| TW | 200809992 | 2/2008 |
| TW | I598966 | 9/2017 |

OTHER PUBLICATIONS

"Office Action of Taiwan Counterpart Application", dated Jun. 17, 2020, p. 1-p. 4.

*Primary Examiner* — Marcos D. Pizarro
(74) *Attorney, Agent, or Firm* — JCIPRNET

(57) ABSTRACT

A chip package structure including a substrate, a redistribution layer (RDL), a chip and an encapsulant is provided. The RDL is disposed on the substrate. The chip is disposed on the RDL and is electrically connected with the RDL. The encapsulant is disposed on the RDL and encapsulates the chip. The chip is located in the high stress region. From a top view, the chip is located in the high stress region, and the low stress region surrounds the high stress region. The RDL includes at least one first device located in the high stress region. From the top view, the extending direction of the at least one first device is parallel to a stress direction at a position thereof.

19 Claims, 11 Drawing Sheets

(56) References Cited

U.S. PATENT DOCUMENTS

2004/0110366 A1* 6/2004 MacKay .............. B23K 1/0016
                                                    438/613
2019/0088581 A1   3/2019 Yu et al.

* cited by examiner

CHIP PACKAGE STRUCTURE

CROSS-REFERENCE TO RELATED APPLICATION

This application claims the priority benefit of Taiwan application no. 108146251, filed on Dec. 17, 2019. The entirety of the above-mentioned patent application is hereby incorporated by reference herein.

TECHNICAL FIELD

The disclosure relates to a chip package structure.

BACKGROUND

In recent years, the semiconductor-related industries gradually advance along with growing demand for more power functions, faster signal transmission speeds and increasing density of circuit devices of the electronic products. In the semiconductor package manufacturing process adopted by the semiconductor industry, a chip is generally disposed on a redistribution layer (RDL), and an encapsulant is formed on the RDL to encapsulate the chip.

However, the encapsulant and devices (e.g., a wire, a conductive via and so on) in the RDL, due to being made of different materials, have different thermal expansion coefficients, and thus, a delamination phenomenon occurs to the devices in the RDL due to the affection of a stress during a subsequent thermal process.

SUMMARY

A chip package structure including a substrate, a redistribution layer (RDL), a chip and an encapsulant is introduced herein. The RDL is disposed on the substrate. The chip is disposed on the RDL and is electrically connected with the RDL. The encapsulant is disposed on the RDL and encapsulates the chip. The chip package structure has a high stress region and a low stress region. From a top view, the chip is located in the high stress region, and the low stress region surrounds the high stress region. The RDL includes at least one first device located in the high stress region, and from the top view, an extending direction of the at least one first device is parallel to a stress direction at a position thereof.

A chip package structure including a substrate, a redistribution layer (RDL), a chip and an encapsulant is introduced herein. The RDL is disposed on the substrate. The chip is disposed on the RDL and is electrically connected with the RDL. The encapsulant is disposed on the RDL and encapsulates the chip. The chip package structure has a high stress region and a low stress region. From a top view, the chip is located in the high stress region, the low stress region surrounds the high stress region, the chip has a plurality of sides, and a distance between one of the sides and a boundary of the high stress region is 0.75 times±10% of a length of the side. The RDL includes at least one first device located in the low stress region, and an aspect ratio of the at least one first device is greater than or equal to 3.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
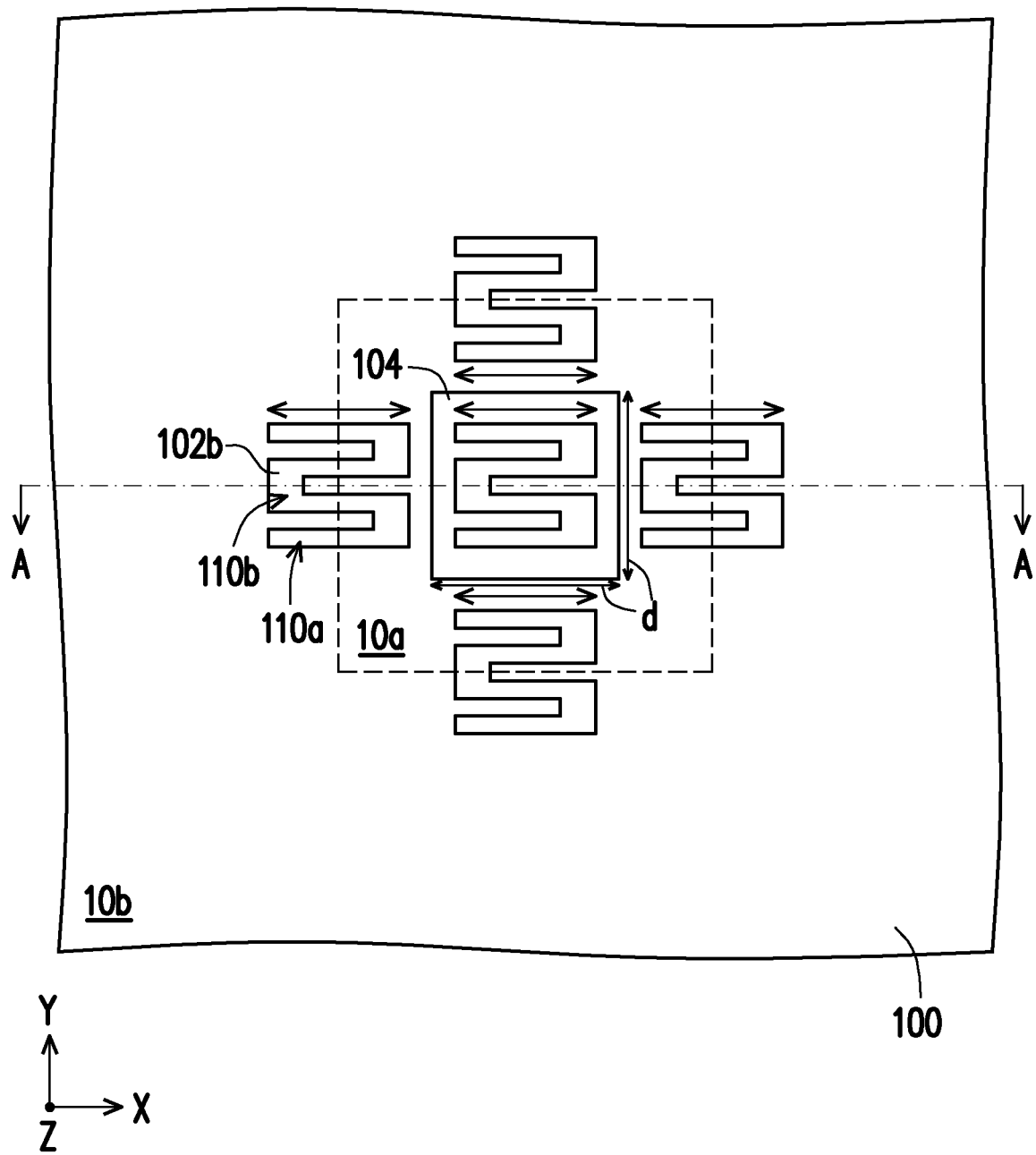
FIG. 1A is a schematic top view illustrating a chip package structure according to a first embodiment of the disclosure.

In the embodiments below, device sizes, distances, widths and so on are all exemplary in the drawings, and for clarity, they are not illustrated in the same way as the actual situation and not illustrated according to actual ratios.

Figure 1B:
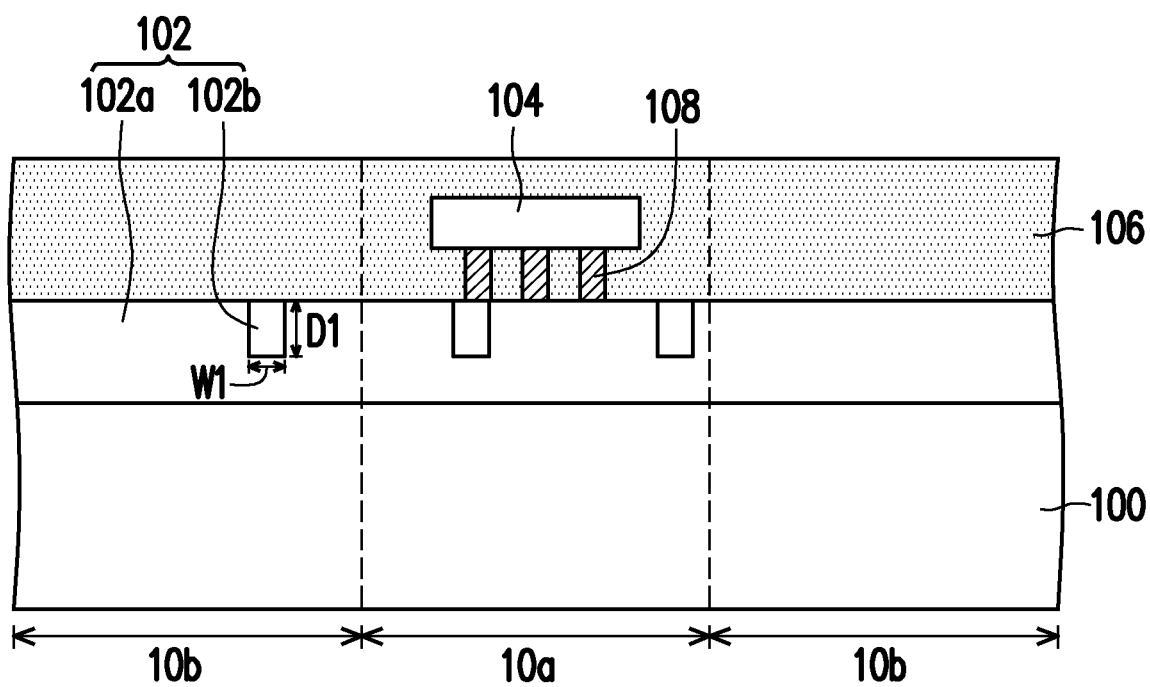
FIG. 1B is a schematic cross-sectional view illustrating the chip package structure along a line A-A in FIG. 1A.

FIG. 1A is a schematic top view illustrating a chip package structure according to a first embodiment of the disclosure. FIG. 1B is a schematic cross-sectional view illustrating the chip package structure along a line A-A in FIG. 1A. In order to clearly show important devices of the disclosure in the top view, only relative positions between chips and devices in a redistribution layer (RDL) on a substrate are illustrated in FIG. 1A. Moreover, in the disclosure, a "direction of top view" refers to a direction from a chip toward a substrate.

Referring to FIG. 1A and FIG. 1B simultaneously, a chip package structure of the present embodiment includes a substrate 100, a redistribution layer (RDL) 102, a chip 104 and an encapsulant 106. The RDL 102 is disposed on the substrate 100. The substrate 100 may include a glass substrate or a flexible substrate and an insulating layer disposed thereon. The flexible substrate includes an organic material (or referred to as a polymer). The organic material is, for example, one of or a combination of two or more of polyimide (PI), polymethyl methacrylate (PMMA), polycarbonate (PC), polyether sulfone (PES), polyamide (PA), polyethylene terephthalate (PET), polyether ether ketone (PEEK), polyethylene naphthalate (PEN), polyethylenimine (PEI), polyurethane (PU), polydimethylsiloxane (PDMS), acrylic, an ether-containing polymer and polyolefin, but the disclosure is not limited thereto. A variety of electronic devices (e.g., active devices) may be disposed in the insulating layer, but the disclosure is not limited thereto. The RDL 102 includes an insulating layer 102a and devices 102b (e.g., wires, conductive vias, coils, active devices (e.g., transistors), passive devices (e.g., resistors, capacitors or inductors), etc.) disposed in the insulating layer 102a. According to an actual circuit design, the devices 102b may be devices having a high aspect ratio (for example, greater than or equal to 3), but the disclosure is not limited thereto. For example, the device 102b may be a wire and have a depth D1 and a width W1. Thus, the aspect ratio of the device 102b is D1/W1. Moreover, in FIG. 1B, the number and positions of the devices 102b are only exemplary, and are not intended to limit the disclosure.

The chip 104 is disposed on the RDL 102 and is electrically connected with the devices 102b in the RDL 102 via connection devices 108. The connection device 108 may be a conductive via, a bump, a conductive adhesive, etc., which is not limited in the disclosure. The chip 104 may be any semiconductor chip, which is not limited in the disclosure. The encapsulant 106 is disposed on the RDL 102 and encapsulates the chip 104. A material of the encapsulant 106 includes an epoxy molding compound (EMC), which is not limited in the disclosure. In the present embodiment, from a top view (a direction from the chip 104 toward the substrate 100), the chip 104 is a square shape having four sides, but the disclosure is not limited thereto. In other embodiments, the number of the sides and the shape of the chip 104 may vary with actual requirements.

When a thermal process is performed on the chip package structure, there is stress generated because the encapsulant 106 and the devices 102b in the RDL 102 have different thermal expansion coefficients due to being made of different materials. In general, a maximum stress usually may be generated in a region directly under a chip (in a Z direction), and the periphery of the chip also belongs to a high stress region. In the present embodiment, according to the direction of top view of the chip package structure, the periphery of the chip 104 and the region directly under the chip 104 in the Z direction are defined as a high stress region 10a, and a region other than the high stress region is defined as a low stress region 10b.

The chip 104 is located in the high stress region 10a, and the low stress region 10b surrounds the high stress region 10a. A distance between one of the sides of the chip 104 and a boundary of the high stress region 10a is 0.75 times±10% of a length of the side. That is to say, when the length of one of the sides of the chip 104 is d, the distance between the side and the boundary of the high stress region 10a is 0.75 times±10% of d. For example, in the present embodiment, as illustrated in FIG. 1A, when a length of an upper side of the chip 104 is d, the distance between the upper side and the boundary of the high stress region 10a is 0.75d. Moreover, distances between the rest of the sides and the boundary of the high stress region 10a may be defined in the same way. That is to say, in the present embodiment, when the length of each of the sides of the chip 104 having the square shape is d, the high stress region 10a also has a square shape, and a length of each of the sides may be 2.5d. In the high stress region 10a, the device 102b of the RDL 102 under the chip 104 are much affected by the stress, and thus, the disposition of the device 102b has to be specially considered.

In the present embodiment, in order to prevent the device 102b of the RDL 102 under the chip 104 from being delaminated due to the stress in the high stress region 10a, an extending direction of the devices 102b is disposed to be parallel to a stress direction at positions thereof when the devices 102b are disposed. In the present embodiment, the RDL has 5 identical devices 102b disposed in the high stress region 10a, and from the top view, the devices 102b include first portions 110a (i.e., long sides of the devices 102b) in the extending direction (an X direction) and second portions 110b (i.e., short sides of the devices 102b) in a direction (a Y direction) intersected with the extending direction. In other embodiments, the RDL 102 may have other numbers of the devices 102b, and patterns of the devices 102b may be the same as each other or different from each other.

Moreover, in FIG. 1A, a double-headed arrow represents a stress direction. For example, in the present embodiment, due to the affection of a size (an X-directional size is greater than a Y-directional size) of the substrate 100, stress directions above and under the chip 104 are both the horizontal direction (the X direction), stress directions at the left and right of the chip 104 are both the horizontal direction (the X direction), and a stress direction under the chip 104 in the Z direction is the horizontal direction (the X direction).

In the present embodiment, the first portions 110a are disposed to be parallel to the stress direction. Moreover, each second portion 110b is disposed to have a greater line width. For example, a width of each second portion 110b is at least two times of a width of each first portion 110a. In this way, since the first portions 110a are disposed to be parallel to the stress direction and each second portions 110b is disposed to have a greater width, when the thermal process is performed on the chip package structure, the devices 102b may still be stable without being delaminated even though they are disposed in the high stress region 10a. In other embodiments, one of disposing the first portions 110a to be parallel to the stress direction and disposing each second portion 110b to have the greater width may be selected for implementation.

Figure 9:
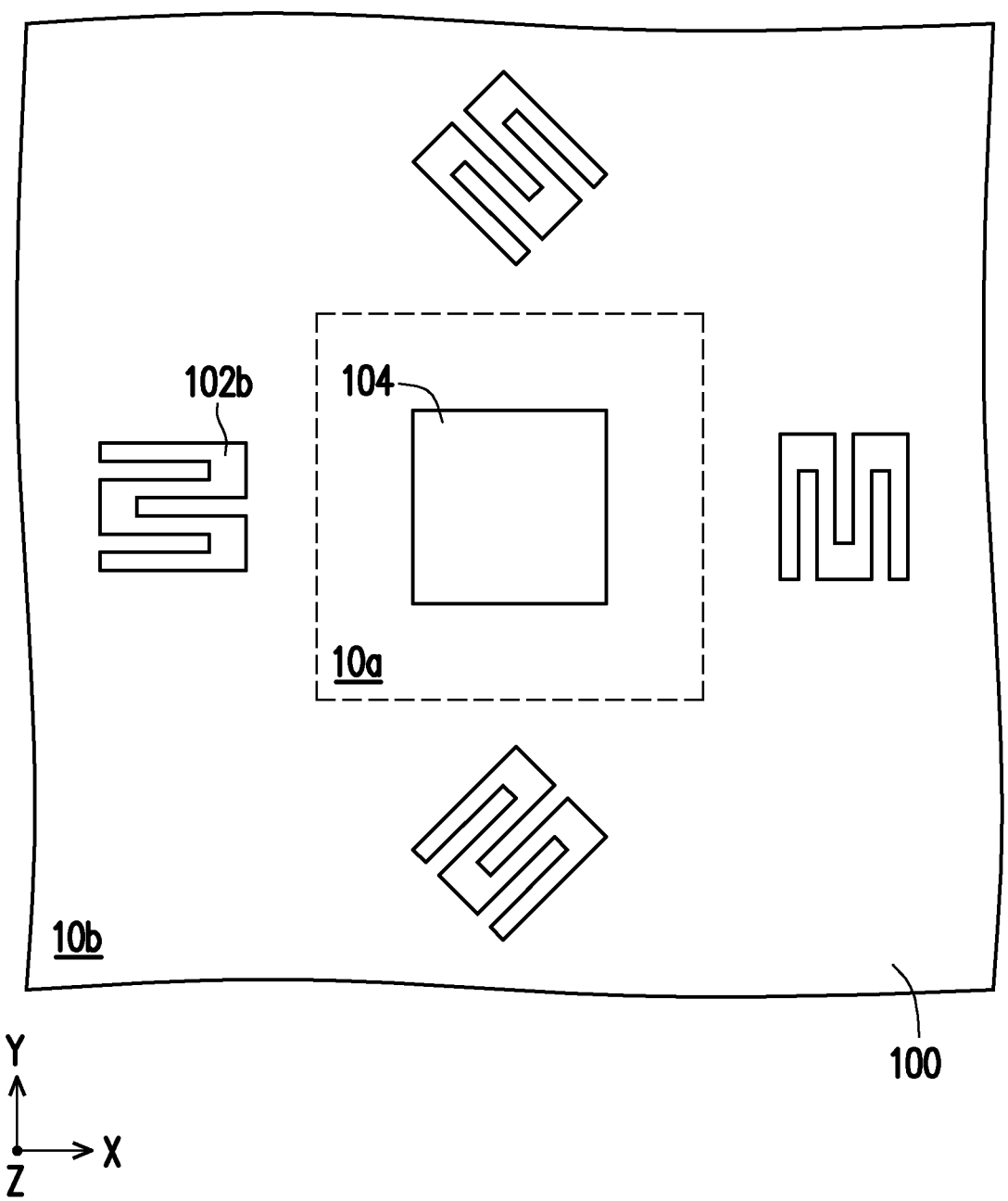
FIG. 9 is a schematic top view illustrating that the devices of the RDL are disposed in the low stress region.

Moreover, regarding the low stress region 10b surrounding the high stress region 10a, since the generated stress may be inefficient for causing the delamination of the devices 102b in the RDL 102, the devices of the RDL 102 in the low stress region 10b may be disposed in an ordinary manner or, alternatively, may be disposed in the same manner as the device 102b located in the high stress region 10a. When the aspect ratio of the device 102b of the RDL 102 is greater than or equal to 3, the devices 102b disposed in the low stress region 10b may be more stable and prevented from being delaminated due to the stress, as illustrated in FIG. 9.

In above embodiments, no other chips are disposed in the periphery of the chip 104, and thus, the generated stress is merely affected by the size of the substrate 100, but the disclosure is not limited thereto. In other embodiments, the chip package structure may include more chips, and the chips are adjacent to each other. Thus, the generated stress is affected by positions where the chips are located, the devices in the RDL are disposed in the high stress region according to the same manner, which will be described below.

Figure 2:
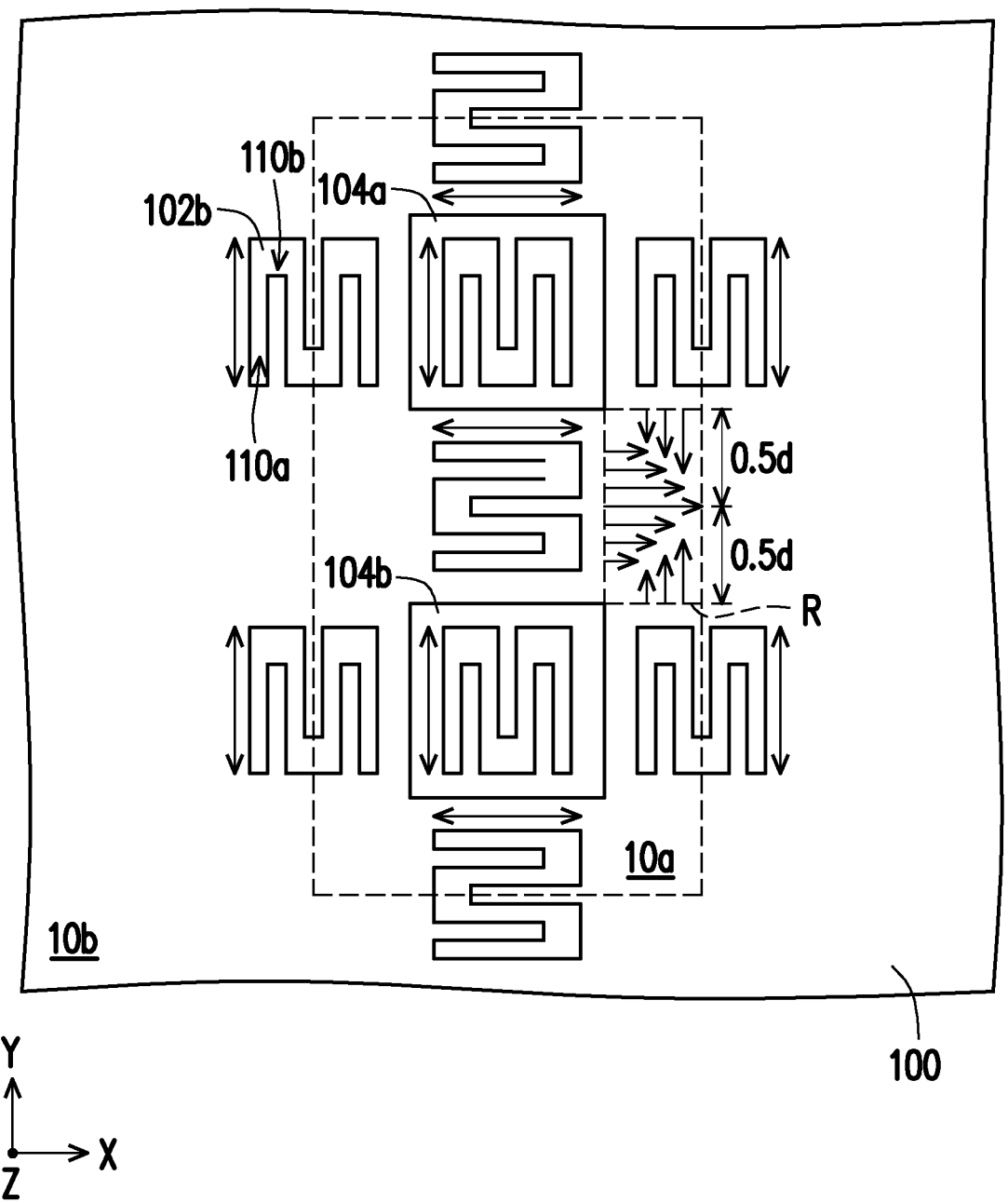
FIG. 2 is a schematic top view illustrating a chip package structure according to a second embodiment of the disclosure.

FIG. 2 is a schematic top view illustrating a chip package structure according to a second embodiment of the disclosure. In the present embodiment, devices which are the same as those in the first embodiment are labeled by the same numerals and will not be repeatedly described.

Referring to FIG. 2, a chip package structure of the present embodiment includes a substrate 100, an RDL 102 (referring to FIG. 1B), a chip 104a, a chip 104b and an encapsulant 106 (referring to FIG. 1B). In the present embodiment, from the top view, the chips 104a and 104b have the same shape (the square shape) and the same size as the chip 104 of the first embodiment, the chips 104a and 104b are disposed on the RDL 102, and a distance therebetween in the Y direction is smaller than or equal to the length d of each of the sides of the chips. Thus, any range within a specific distance (0.75d±10%) of the periphery of each of the chips 104a and 104b belongs to the high stress region 10a, and a region between the chips 104a and 104b also belongs to the high stress region 10a.

In the present embodiment, as illustrated in FIG. 2, based on a stress interaction between the chips 104a and 104b, stress directions above and under the chips 104a and 104b are both the horizontal direction (the X direction), stress directions at the left and right of the chips 104a and 104b are both the vertical direction (the Y direction), and a stress direction under the chips 104a and 104b in the Z direction are both the vertical direction (the Y direction). Moreover, in a region R corresponding to a chip corner, a stress direction corresponds to a stress direction in the peripheral region, as shown by a single arrow in the region R.

According to the same manner of the first embodiment, the devices 102b in the RDL 102 are disposed in the high stress region 10a. As illustrated in FIG. 2, each first portion 110a is disposed to be parallel to the stress direction, and each second portion 110b is disposed to have the greater line width (for example, a width of each second portion 110b is at least two times of a width of each first portion 110a). In this way, since the first portions 110a are disposed to be parallel to the stress direction and each second portion 110b is disposed to have the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

Figure 3:
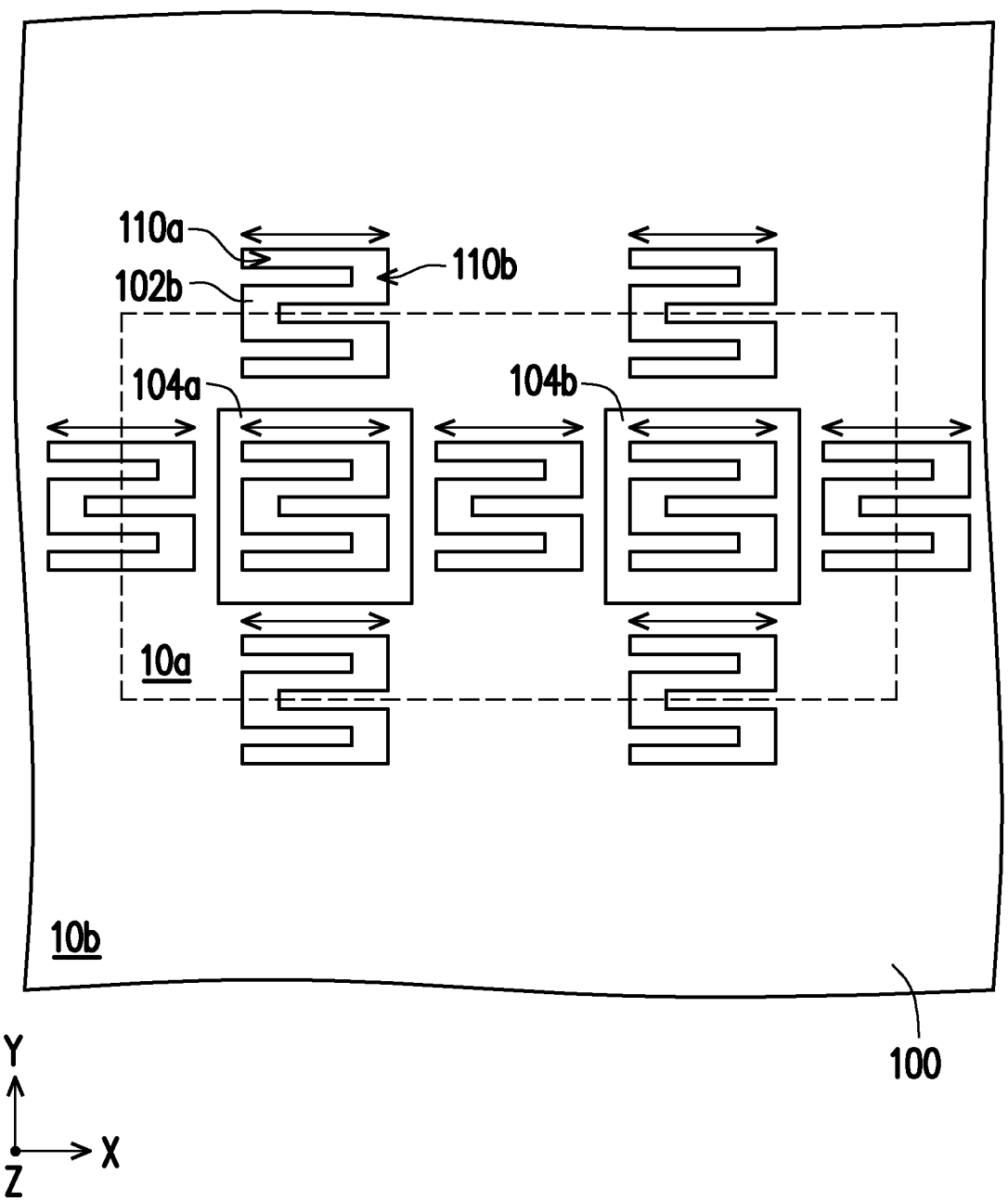
FIG. 3 is a schematic top view illustrating a chip package structure according to a third embodiment of the disclosure.

FIG. 3 is a schematic top view illustrating a chip package structure according to a third embodiment of the disclosure. In the present embodiment, devices which are the same as those in the first embodiment are labeled by the same numerals and will not be repeatedly described.

Referring to FIG. 3, a chip package structure of the present embodiment includes a substrate 100, an RDL 102 (referring to FIG. 1B), a chip 104a, a chip 104b and an encapsulant 106 (referring to FIG. 1B). In the present embodiment, from the top view, the chips 104a and 104b have the same shape (the square shape) and the same size as the chip 104 of the first embodiment, the chips 104a and 104b are disposed on the RDL 102, and a distance therebetween in the X direction is smaller than or equal to the length d of each of the sides of the chip. Thus, any range within a specific distance (0.75d±10%) of the periphery of each of the chips 104a and 104b belongs to the high stress region 10a, and a region between the chips 104a and 104b also belongs to the high stress region 10a.

In the present embodiment, as illustrated in FIG. 3, based on the stress interaction between the chips 104a and 104b, the stress directions above and under the chips 104a and 104b are both the horizontal direction (the X direction), the stress directions at the left and right of the chips 104a and 104b are both the horizontal direction (the X direction), and a stress directions under the chips 104a and 104b in the Z direction is the horizontal direction (the X direction).

According to the same manner of the first embodiment, the devices 102b in the RDL 102 are disposed in the high stress region 10a. As illustrated in FIG. 3, the first portions 110a are disposed to be parallel to the stress direction, and each second portion 110b is disposed to have the greater line width (for example, the width of each second portion 110b is at least two times of the width of each first portion 110a). In this way, since the first portions 110a are disposed to be parallel to the stress direction and each second portion 110b has the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

Figure 4:
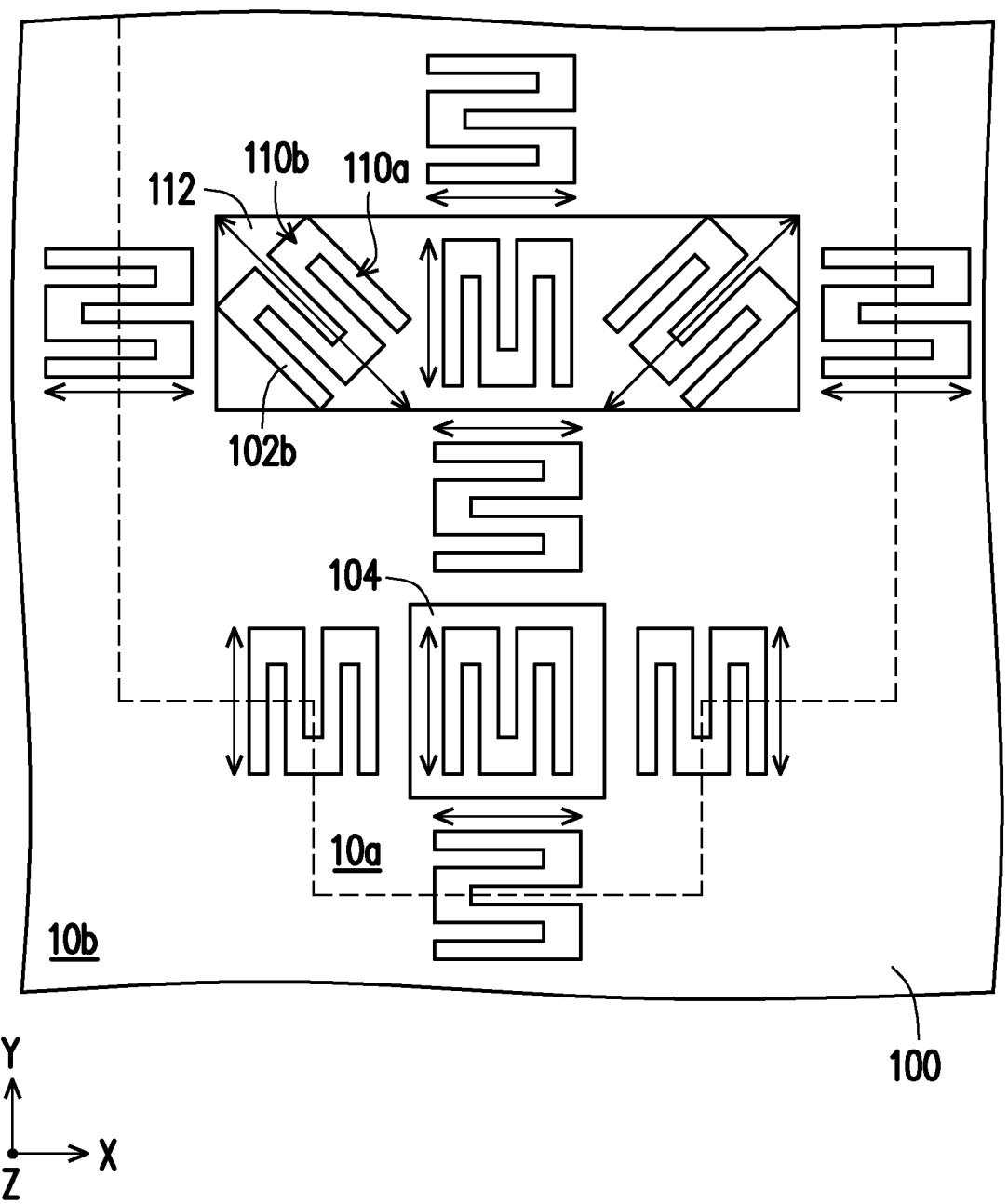
FIG. 4 is a schematic top view illustrating a chip package structure according to a fourth embodiment of the disclosure.

FIG. 4 is a schematic top view illustrating a chip package structure according to a fourth embodiment of the disclosure. In the present embodiment, devices which are the same as those in the first embodiment are labeled by the same numerals and will not be repeatedly described.

Referring to FIG. 4, a chip package structure of the present embodiment includes a substrate 100, an RDL 102 (referring to FIG. 1B), a chip 104, a chip 112 and an encapsulant 106 (referring to FIG. 1B). In the present embodiment, from the top view, the chips 104 and 112 have different shapes. The shape of the chip 104 is a square shape, and the shape of the chip 112 is a rectangular shape extending in the X direction. A length of each of four sides of the chip 104 is d, a length of each side of the chip 112 in the X direction is 3d, and a length of each side in the Y direction is d. Moreover, the chips 104 and 112 are disposed on the RDL 102, a distance therebetween in the X direction is smaller than or equal to the length d, and the chip 104 is aligned to a central part of the chip 112. Thus, any range within a specific distance (0.75d±10%) of the periphery of the chip 104 and of the periphery at the left and right of the chip 112 belongs to the high stress region 10a, any range within a specific distance (2.25d±10%) of the periphery above and under the chip 112 belongs to the high stress region 10a, and a region between the chips 104 and 112 also belongs to the high stress region 10a.

In the present embodiment, as illustrated in FIG. 4, based on a stress interaction between the chips 104 and 112, the stress directions above and under the chip 104 are both the horizontal direction (the X direction), the stress directions at the left and right of the chip 104 are both the vertical direction (the Y direction), and the stress direction under the chip 104 in the Z direction is the vertical direction (the Y direction). Moreover, as the central part of the chip 112 is aligned to the chip 104, stress directions above and under the chip 112 are both the horizontal direction (the X direction), stress directions at the left and right of the chip 112 are both the horizontal direction (the X direction), a stress direction under the central part of the chip 112 in the Z direction is the vertical direction (the Y direction), a stress direction under the left of the chip 112 in the Z direction is a direction from upper left to lower right, and a stress direction under the right of the chip 112 in the Z direction is a direction from upper right to lower left.

According to the same manner of the first embodiment, the devices 102b in the RDL 102 are disposed in the high stress region 10a. As illustrated in FIG. 4, the first portions 110a are disposed to be parallel to the stress direction, and each second portion 110b is disposed to have the greater line width (for example, the width of each second portion 110b is at least two times of the width of each first portion 110a). In this way, since the first portions 110a are disposed to be parallel to the stress direction and each second portion 110b has the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

Figure 5:
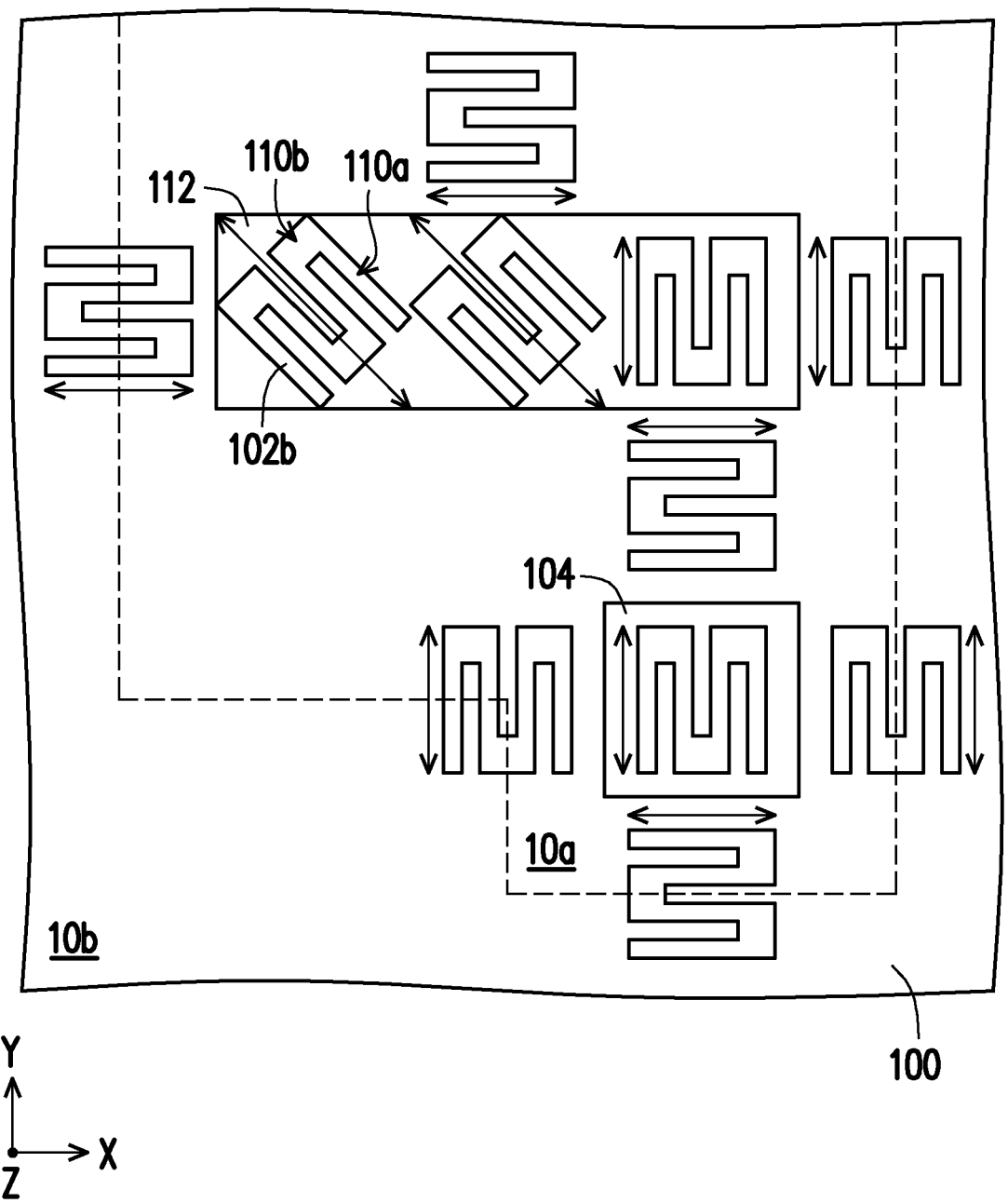
FIG. 5 is a schematic top view illustrating a chip package structure according to a fifth embodiment of the disclosure.

FIG. 5 is a schematic top view illustrating a chip package structure according to a fifth embodiment of the disclosure. In the present embodiment, devices which are the same as those in the fourth embodiment are labeled by the same numerals and will not be repeatedly described.

Referring to FIG. 5, in the present embodiment, it is different from the fourth embodiment in that the chip 104 is aligned to the right of the chip 112. In the present embodiment, as illustrated in FIG. 5, based on the stress interaction between the chips 104 and 112, the stress directions above and under the chip 104 are both the horizontal direction (the X direction), the stress directions at the left and right of the chip 104 are both the vertical direction (the Y direction), and the stress direction under the chip 104 in the Z direction is the vertical direction (the Y direction). Moreover, as the right part of the chip 112 is aligned to the chip 104, a stress direction at the right of the chip 112 is the vertical directions (the Y direction), a stress direction at the left of the chip 112 is the horizontal direction (the X direction), a stress direction under the right part of the chip 112 in the Z direction is the vertical direction (the Y direction), and stress directions under the central part and the left of the chip 112 in the Z direction are the direction from upper left to lower right.

According to the same manner of the first embodiment, the devices 102b in the RDL 102 are disposed in the high stress region 10a. As illustrated in FIG. 5, the first portions 110a are disposed to be parallel to the stress direction, and each second portion 110b is disposed to have the greater line width (for example, the width of each second portion 110b is at least two times of the width of each first portion 110a). In this way, since the first portions 110a are disposed to be parallel to the stress direction and each second portion 110b has the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

Figure 6:
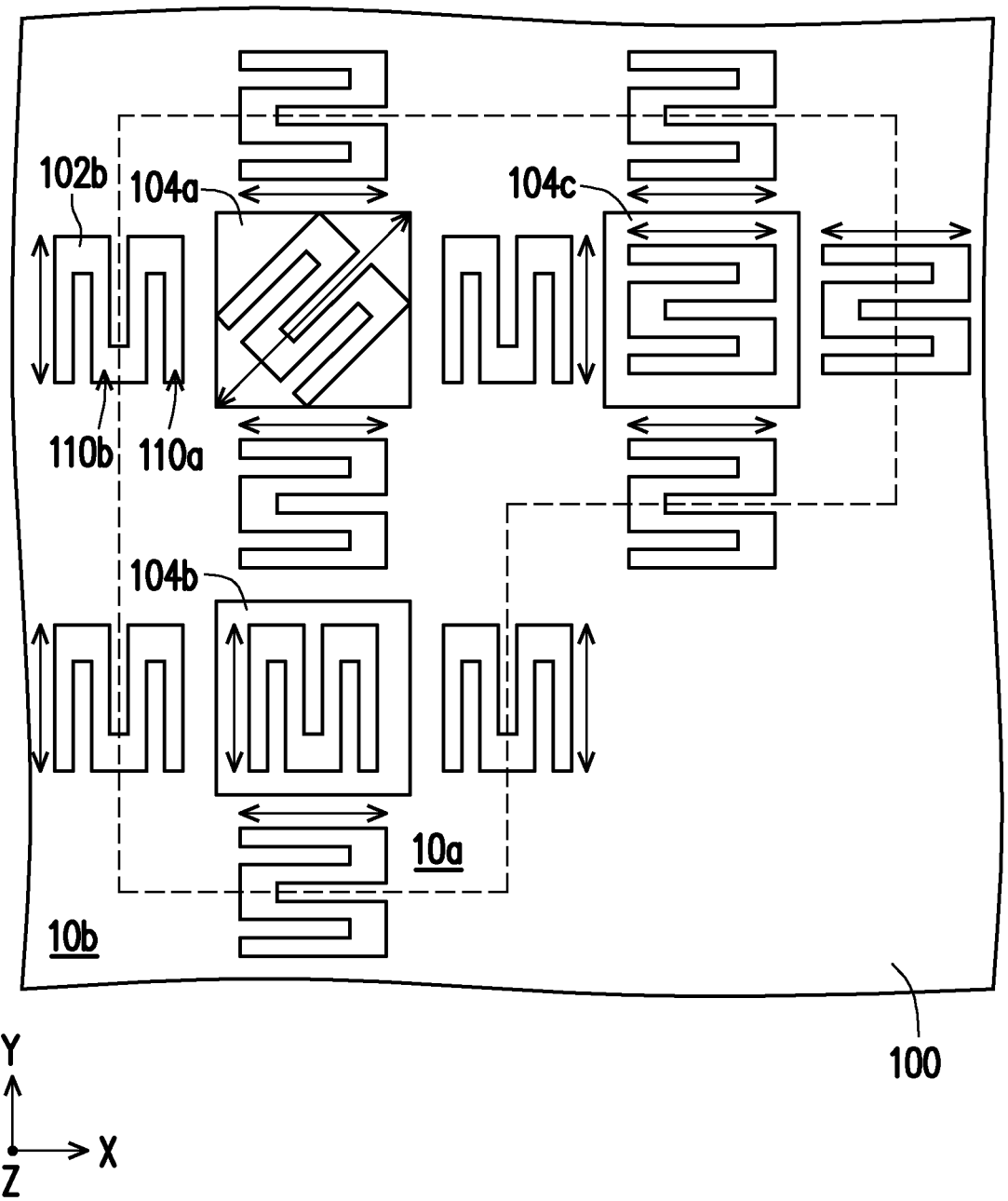
FIG. 6 is a schematic top view illustrating a chip package structure according to a sixth embodiment of the disclosure.

FIG. 6 is a schematic top view illustrating a chip package structure according to a sixth embodiment of the disclosure. In the present embodiment, devices which are the same as those in the first embodiment are labeled by the same numerals and will not be repeatedly described.

Referring to FIG. 6, a chip package structure of the present embodiment includes a substrate 100, an RDL 102 (referring to FIG. 1B), a chip 104a, a chip 104b, a chip 104c and an encapsulant 106 (referring to FIG. 1B). In the present embodiment, from the top view, each of the chips 104a, 104b and 104c has the same shape (the square shape) and the same size as the chip 104 of the first embodiment, and the chips 104a, 104b and 104c are disposed on the RDL 102. In the Y direction, a distance between the chips 104a and 104b is smaller than or equal to a length d of each of the sides of the chip. In the X direction, a distance between the chips 104a and 104c is smaller than or equal to the length d of each of the sides of the chip. Thus, any range within a specific distance (0.75d±10%) of the periphery of each of the chips 104a, 104b and 104c belongs to the high stress region 10a, and a region between the chips 104a and 104b and a region between the chips 104a and 104c also belong to the high stress region 10a.

In the present embodiment, as illustrated in FIG. 6, based on a stress interaction among the chips 104a, 104b and 104c, stress directions above and under the chips 104a, 104b and 104c are both the horizontal direction (the X direction), stress directions at the left and right of the chips 104a and 104b and at the left of the chip 104c are the vertical direction (the Y direction), a stress direction at the right of the chip 104a is the horizontal direction (the X direction), a stress direction under the chip 104a in the Z direction is a direction from lower left to upper right, a stress direction under the chip 104b in the Z direction is the vertical direction (the Y direction), and a stress direction under the chip 104c in the Z direction is the horizontal direction (the X direction).

According to the same manner of the first embodiment, the devices 102b in the RDL 102 are disposed in the high stress region 10a. As illustrated in FIG. 6, the first portions 110a are disposed to be parallel to the stress direction, and each second portion 110b is disposed to have the greater line width (for example, the width of each second portion 110b is at least two times of the width of each first portion 110a). In this way, since the first portions 110a are disposed to be parallel to the stress direction and each second portion 110b has the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

Figure 7:
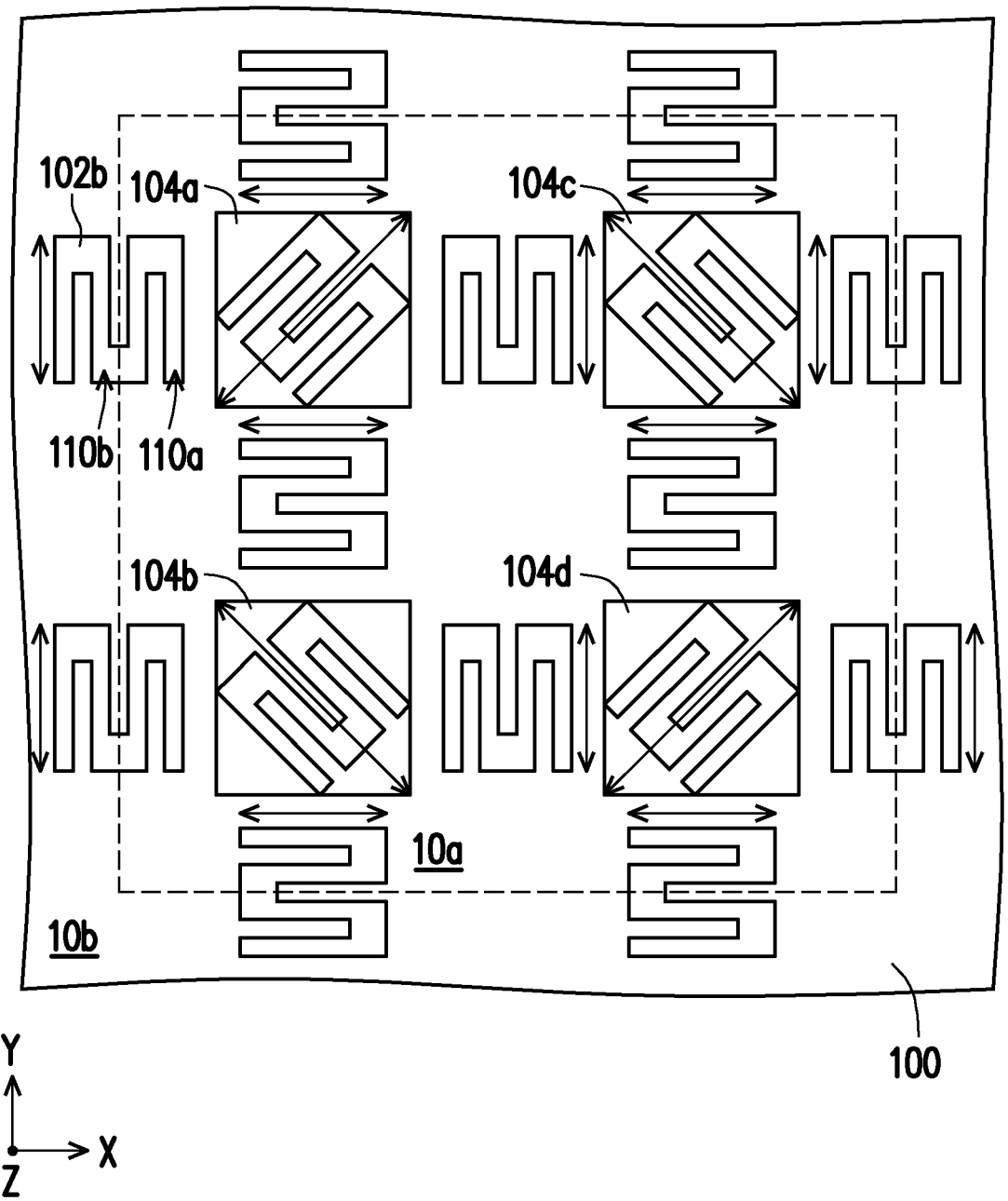
FIG. 7 is a schematic top view illustrating a chip package structure according to a seventh embodiment of the disclosure.

FIG. 7 is a schematic top view illustrating a chip package structure according to a seventh embodiment of the disclosure. In the present embodiment, devices which are the same as those in the first embodiment are labeled by the same numerals and will not be repeatedly described.

Referring to FIG. 7, a chip package structure of the present embodiment includes a substrate 100, an RDL 102 (referring to FIG. 1B), a chip 104a, a chip 104b, a chip 104c, a chip 104d and an encapsulant 106 (referring to FIG. 1B). In the present embodiment, from the top view, each of the chips 104a, 104b, 104c and 104d has the same shape (the square shape) and the same size as the chip 104 of the first embodiment, and the chips 104a, 104b, 104c and 104d are disposed on the RDL 102. In the Y direction, the distance between the chips 104a and 104b is smaller than or equal to the length d of each of the sides of the chips, and a distance between the chips 104c and 104d is smaller than or equal to the length d of each of the sides of the chips. In the X direction, the distance between the chips 104a and 104c is smaller than or equal to the length d of each of the sides of the chips, and a distance between the chips 104b and 104d is smaller than or equal to the length d of each of the sides of the chips. Thus, any range within a specific distance (0.75d±10%) of the periphery of each of the chips 104a, 104b, 104c and 104d belongs to the high stress region 10a, and a region between the chips 104a and 104b, a region between the chips 104a and 104c, a region between the chips 104b and 104d, and a region between the chips 104c and 104d also belong to the high stress region 10a.

In the present embodiment, as illustrated in FIG. 7, based on a stress interaction among the chips 104a, 104b, 104c and 104d, stress directions above and under the chips 104a, 104b, 104c and 104d are all the horizontal direction (the X direction), stress directions at the left and right of the chips 104a, 104b, 104c and 104d are the vertical direction (the Y direction), stress directions under the chips 104a and 104d in the Z direction are the direction from upper right to lower left, and stress directions under the chips 104b and 104c in the Z direction are the direction from upper left to lower right.

According to the same manner of the first embodiment, the devices 102b in the RDL 102 are disposed in the high stress region 10a. As illustrated in FIG. 7, the first portions 110a are disposed to be parallel to the stress direction, and each second portion 110b is disposed to have the greater line width (for example, the width of each second portion 110b is at least two times of the width of each first portion 110a). In this way, since the first portions 110a are disposed to be parallel to the stress direction and each second portion 110b has the greater width, when the thermal process is performed on the chip package structure, the devices 102b may still be stable and prevented from being delaminated even though they are disposed in the high stress region 10a. In other embodiments, one of disposing the first portions 110a to be parallel to the stress direction and disposing each second portion 110b to have the greater width may be selected for implementation.

Moreover, regarding the low stress region 10b surrounding the high stress region 10a, since the generated stress is insufficient for causing the delamination of the devices 102b in the RDL 102, the devices of the RDL 102 in the low stress region 10b may be disposed in the ordinary manner or, alternatively, may be disposed in the same manner as the devices 102b disposed in the high stress region 10a.

In each of the above embodiments, from the top view, the devices 102b includes the first portions 110a (i.e., the long sides of the devices 102b) in its extending direction and the second portions 110b (i.e., the short sides of the devices 102b) in a direction intersected with the extending direction, but the disclosure is not limited thereto. In other embodiments, the devices 102b may include only the first portions 110a in its extending direction, i.e., the devices 102b may be devices having a stripe-shaped pattern.

Moreover, in each of the embodiments described above, when the devices 102b includes the first portions 110a and the second portions 110b, and each second portion 110b has the greater line width (for example, the width of each second portion 110b is at least two times of the width of each first portion 110a), thereby stabilizing the second portions 110b, but the disclosure is not limited thereto. In other embodiments, the width of each second portion 110b may be the same as the width of each first portion 110a, and the occurrence of a delamination phenomenon may be prevented by reinforcement structures disposed in the periphery of the second portions 110b, which will be described below.

Figure 8A:
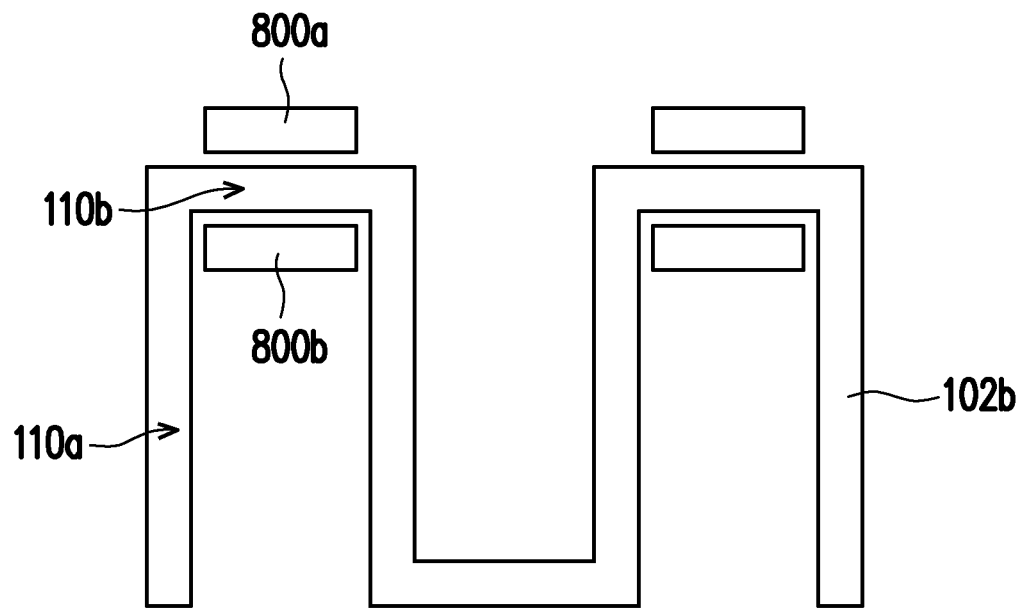
FIG. 8A is a schematic top view illustrating the device of the redistribution layer (RDL) according to an embodiment of the disclosure.
Figure 8B:
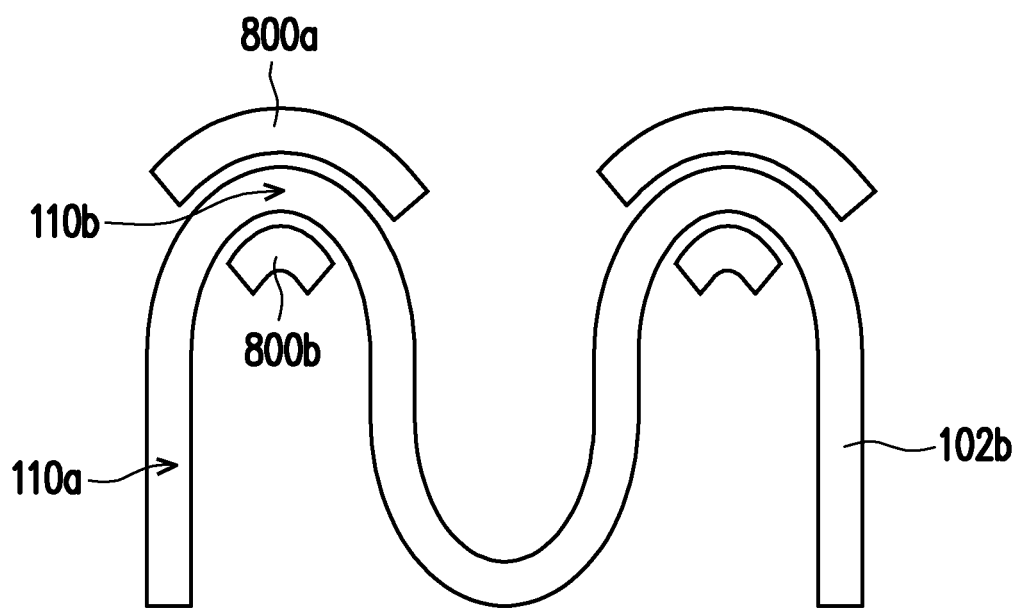
FIG. 8B is a schematic top view illustrating the device of the RDL according to another embodiment of the disclosure.

FIG. 8A is a schematic top view illustrating the device of the RDL according to an embodiment of the disclosure. As illustrated in FIG. 8A, in the present embodiment, the device 102b includes a first portion 110a and a second portion 110b, and the width of the second portion 110b may be the same as the width of the first portion 110a. Moreover, a reinforcement structure 800a and a reinforcement structure 800b are respectively disposed at two sides of the second portion 110b, and distances from the second portion 110b is, for example, 0.5 times±10% of the width of the second portion 110b. Widths of the reinforcement structures 800a and 800b are, for example, the same as the width of the second portion 110b, but the disclosure is not limited thereto. The reinforcement structures 800a and 800b are respectively disposed in parallel to the second portion 110b. Moreover, in other embodiments, the reinforcement structures may be only disposed at one of the sides of the second portion 110b depending on actual situations, or more reinforcement structures may be disposed. Shapes of the reinforcement structures 800a and the reinforcement structures 800b are not limited in the disclosure. For example, depending on the pattern of the device 102b, the reinforcement structures 800a and 800b may have a curved shape, as illustrated in FIG. 8B.

Figure 10:
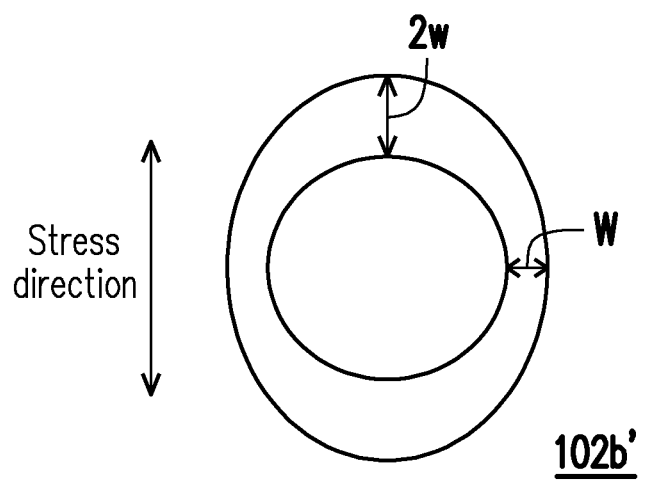
FIG. 10 is a schematic top view illustrating a device of the RDL according to an embodiment of the disclosure.

Moreover, in each of the embodiments described above, from the top view, the device 102b of the RDL 102 includes the first portion 110a and the second portion 110b having a straight-line shape, but the disclosure is not limited thereto. In other embodiments, from the top view, the device of the RDL 102 may have a curved or a circular shape. In the aforementioned conditions, the device of the RDL 102 is disposed according to the same manner of the first embodiment, for example, the long side of the device is disposed to be parallel to the stress direction, and the short side is disposed to have a greater line width or to have reinforcement structures disposed adjacent to the short side. For example, as illustrated in FIG. 10, when a device 102b' of the RDL 102 has a circular shape, a width at the top of an arc of the short side is at least two times of a normal width W, and a width of the rest is gradually decreased to the normal width from the top.

Based on the above, the chip package structure provided by the embodiments of the disclosure can prevent the devices in the RDL from being delaminated due to the affection of the stress.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip package structure, comprising:
a substrate;
a redistribution layer (RDL), disposed on the substrate;
a chip, disposed on the RDL and is electrically connected with the RDL; and
an encapsulant, disposed on the RDL and encapsulating the chip,
wherein the chip package structure has a high stress region and a low stress region, and from a top view, the chip is located in the high stress region, the low stress region surrounds the high stress region, the chip has a plurality of sides, and a distance between one of the sides and a boundary of the high stress region is 0.75 times±10% of a length of the side,
wherein the RDL comprises at least one first device located in the low stress region, and an aspect ratio of the at least one first device is greater than or equal to 3.

2. The chip package structure as claimed in claim 1, wherein the RDL further comprises at least one second device located in the high stress region, from the top view, the at least one second device comprises a first portion in the extending direction and a second portion in a direction intersected with the extending direction, and a width of the second portion is at least two times of the width of the first portion.

3. The chip package structure as claimed in claim 1, wherein the at least one first device comprises a wire, a conductive via, an active device or a passive device.

4. The chip package structure as claimed in claim 1, wherein the RDL further comprises at least one second device located in the high stress region, from the top view, the at least one second device comprises a first portion in the extending direction and a second portion in a direction intersected with the extending direction, and the chip package structure further comprises a reinforcement structure disposed adjacent to the second portion.

5. The chip package structure as claimed in claim 4, wherein a distance between the reinforcement structure and the second portion is 0.5 times±10% of the width of the second portion.

6. The chip package structure as claimed in claim 1, wherein the RDL further comprises at least one second device located in the high stress region, and from the top view, an extending direction of the at least one second device is parallel to a stress direction at a position thereof.

7. The chip package structure as claimed in claim 6, wherein an aspect ratio of the at least one second device is greater than or equal to 3.

8. The chip package structure as claimed in claim 6, wherein the at least one second device comprises a wire, a conductive via, an active device or a passive device.

9. A chip package structure, comprising:
a substrate;
a redistribution layer (RDL), disposed on the substrate;
a chip, disposed on the RDL and electrically connected with the RDL; and
an encapsulant, disposed on the RDL and encapsulating the chip,
wherein the chip package structure has a high stress region and a low stress region, and from a top view, the chip is located in the high stress region, and the low stress region surrounds the high stress region, and
wherein the RDL comprises at least one first device located in the high stress region, and from the top view, an extending direction of the at least one first device is parallel to a stress direction at a position thereof, and
wherein from the top view, the chip has a plurality of sides, and a distance between one of the sides and a boundary of the high stress region is 0.75 times±10% of a length of the side.

10. The chip package structure as claimed in claim 9, wherein from the top view, the at least one first device comprises a first portion in the extending direction and a second portion in a direction intersected with the extending direction, and a width of the second portion is at least two times of the width of the first portion.

11. The chip package structure as claimed in claim 9, wherein an aspect ratio of the at least one first device is greater than or equal to 3.

12. The chip package structure as claimed in claim 9, wherein the at least one first device comprises a wire, a conductive via, an active device or a passive device.

13. The chip package structure as claimed in claim 9, wherein from the top view, the at least one first device comprises a first portion in the extending direction and a second portion in a direction intersected with the extending direction, and the chip package structure further comprises a reinforcement structure disposed adjacent to the second portion.

14. The chip package structure as claimed in claim 13, wherein a distance between the reinforcement structure and the second portion is 0.5 times+10% of the width of the second portion.

15. The chip package structure as claimed in claim 9, wherein the RDL further comprises at least one second device located in the low stress region, and from the top view, an extending direction of the at least one second device is parallel to a stress direction at a position thereof.

16. The chip package structure as claimed in claim 15, wherein from the top view, the at least one second device comprises a first portion in the extending direction and a second portion in a direction intersected with the extending direction, and a width of the second portion is at least two times of the width of the first portion.

17. The chip package structure as claimed in claim 15, wherein from the top view, the at least one second device comprises a first portion in the extending direction and a second portion in a direction intersected with the extending direction, and the chip package structure further comprises a reinforcement structure disposed adjacent to the second portion.

18. The chip package structure as claimed in claim 15, wherein an aspect ratio of the at least one second device is greater than or equal to 3.

19. The chip package structure as claimed in claim 15, wherein the at least one second device comprises a wire, a conductive via, an active device or a passive device.

* * * * *